(12) United States Patent
Chen et al.

(10) Patent No.: US 10,699,913 B2
(45) Date of Patent: Jun. 30, 2020

(54) MANUFACTURING METHOD FOR TRENCH

(71) Applicant: UNITED MICROELECTRONICS CORPORATION, Hsinchu (TW)

(72) Inventors: Shin-Chi Chen, Tainan County (TW); Jiunn-Hsiung Liao, Tainan County (TW); Yu-Tsung Lai, Tainan County (TW)

(73) Assignee: UNITED MICROELECTRONICS CORPORATION, Hsinchu (TW)

(*) Notice: Subject to any disclaimer, the term of this patent is extended or adjusted under 35 U.S.C. 154(b) by 32 days.

(21) Appl. No.: 16/219,763

(22) Filed: Dec. 13, 2018

(65) Prior Publication Data

US 2019/0131142 A1 May 2, 2019

Related U.S. Application Data

(62) Division of application No. 13/033,696, filed on Feb. 24, 2011, now Pat. No. 10,199,232.

(51) Int. Cl.
*H01L 21/311* (2006.01)
*H01L 21/768* (2006.01)

(52) U.S. Cl.
CPC .. *H01L 21/31144* (2013.01); *H01L 21/76816* (2013.01)

(58) Field of Classification Search
CPC ............ H01L 21/31144; H01L 21/76816
USPC .......................................... 257/288; 438/455
See application file for complete search history.

(56) References Cited

U.S. PATENT DOCUMENTS

| | | | |
|---|---|---|---|
| 6,750,108 B2 | 6/2004 | Ueda | |
| 7,488,679 B2 | 2/2009 | Standaert et al. | |
| 7,709,275 B2 | 5/2010 | Yang et al. | |
| 7,749,911 B2 | 7/2010 | Wu et al. | |
| 7,781,327 B1 | 8/2010 | Kailasam et al. | |
| 7,799,511 B2 | 9/2010 | Chou et al. | |
| 8,084,357 B2 | 12/2011 | Chen et al. | |
| 2002/0119630 A1* | 8/2002 | Ueda | H01L 29/66545 438/301 |
| 2003/0068867 A1* | 4/2003 | Forster | H01L 27/1087 438/386 |
| 2007/0020565 A1 | 1/2007 | Koh et al. | |
| 2007/0049007 A1 | 3/2007 | Yang et al. | |
| 2008/0026568 A1 | 1/2008 | Standaert et al. | |
| 2008/0171433 A1 | 7/2008 | Huang et al. | |
| 2010/0260992 A1* | 10/2010 | Chen | H01L 21/0214 428/213 |

FOREIGN PATENT DOCUMENTS

| | | |
|---|---|---|
| CN | 101221890 | 7/2008 |
| WO | WO2008115600 | 9/2008 |

OTHER PUBLICATIONS

Internal UMC invention disclosure document, confidential document.

* cited by examiner

*Primary Examiner* — Bo Fan
(74) *Attorney, Agent, or Firm* — Ding Yu Tan

(57) ABSTRACT

Exemplary metal line structure and manufacturing method for a trench are provided. In particular, the metal line structure includes a substrate, a target layer, a trench and a conductor line. The target layer is formed on the substrate. The trench is formed in the target layer and has a microtrench formed at the bottom thereof. A depth of the microtrench is not more than 50 angstroms. The conductor line is inlaid into the trench.

13 Claims, 6 Drawing Sheets

MANUFACTURING METHOD FOR TRENCH

CROSS REFERENCE TO RELATED PATENT APPLICATIONS

This application is a divisional application of U.S. patent application Ser. No. 13/033,696, filed on Feb. 24, 2011, currently pending, and is incorporated by reference.

BACKGROUND

1. Technical Field

The present invention generally relates to the art of semiconductor device and process and particularly, to a manufacturing method for a trench.

2. Description of the Related Art

With the density of integrated circuit on semiconductor chips becoming more and higher, a resolution of photo-mask for defining patterns correspondingly is required to be increased, but due to the limit of wavelength range of exposure light source, the resolution of photo-mask has reached the extremity, accordingly the resolution of photo-mask is difficult to meet the requirements of the next generation integrated circuit except the wavelength of exposure light source can downwardly reduce. In order to solve such problem, a pattern being divided for light exposure by two photo-masks with relatively low resolutions and then combined to be a same layer structure for example a metal line structure nowadays has been a well-known scheme.

Generally, since the misalignment inevitably occurs during light exposure process, line joints respectively defined by two photo-masks would have an overlay area. However, since the overlay area of the two photo-masks would encounter twice etchings, over-etching would easily occur, which would cause some troubles in the subsequent process. Accordingly, how to overcome such drawbacks in the prior art is the major purpose of developing the present invention.

BRIEF SUMMARY

Accordingly, the present invention is directed to a metal line structure for effectively overcoming the drawbacks in the prior art.

The present invention is further directed to a manufacturing method for a trench, for effectively overcoming the drawbacks in the prior art.

More specifically, a metal line structure in accordance with an embodiment of the present invention comprises a substrate, a target layer, a trench and a conductor line. The target layer is formed on the substrate. The trench is formed in the target layer and has a micro-trench formed at the bottom thereof. A depth of the micro-trench is not more than 50 angstroms. The conductor line is inlaid into the trench.

In one embodiment, the substrate comprises a silicon substrate, and the target layer comprises an ultra-low dielectric constant material.

In one embodiment, the conductor line is a gate electrode, and the gate electrode is made of poly-silicon or metal.

In one embodiment, the conductor line is an interconnect line, and the interconnect line is a copper line.

In one embodiment, the micro-trench is formed in a region defined by a first photo-mask partially overlying a second photo-mask.

In one embodiment, the micro-trench is formed in a region defined by a first photo-mask overlying and partially mis-aligned with a second photo-mask.

In one embodiment, the conductor line in the micro-trench is an I-shaped connecting portion, a T-shaped connecting portion, an L-shaped bending portion, a Π-shaped connecting portion or an S-shaped bending portion.

In addition, a manufacturing method for a trench in accordance with another embodiment of the present invention is provided. The manufacturing method comprises steps of: providing a substrate; sequentially forming a target layer and a multi-layered masking layer on the substrate, wherein the multi-layered masking layer at least comprises a metal mask layer and a dielectric layer; forming a first photo-resist structure layer on the multi-layered masking layer; using a first photo-mask to define the first photo-resist structure layer and thereby forming a first opening; using the first opening for etching of an exposed portion of the multi-layered masking layer to partially remove the dielectric layer and thereby exposing the metal mask layer, and removing the first photo-resist structure layer; forming a second photo-resist structure layer on the etched multi-layered masking layer; using a second photo-mask to define the second photo-resist structure layer and thereby forming a second opening partially overlaid with the first opening; using the second opening for etching of an exposed portion of the etched multi-layered masking layer to partially remove the dielectric layer and thereby exposing the metal mask layer, and then removing the second photo-resist structure layer; using the remained dielectric layer as a mask for etching of the exposed metal mask layer and thereby forming a third opening; and using the third opening for etching of an exposed portion of the target layer and thereby forming the trench.

In one embodiment, the manufacturing method further comprises a step of inlaying a conductor line into the trench.

In one embodiment, the multi-layered masking layer further comprises a buffer layer arranged between the metal mask layer and the target layer.

In one embodiment, the buffer layer is made of silicon oxynitride or boron nitride, the metal mask layer is a titanium nitride/titanium layer, the dielectric layer is made of silicon oxide, silicon nitride, silicon oxynitride, silicon carbide or silicon oxycarbide, the metal mask layer and the buffer layer have an etching selectivity ratio larger than 8, and the dielectric layer and the metal mask layer have an etching selectivity ratio larger than 5.

In one embodiment, the first photo-resist structure layer and the second photo-resist structure layer each is a tri-layered photo-resist structure layer.

In one embodiment, a thickness of the dielectric layer falls in the range between five times of a thickness of the metal mask layer and 0.8 times of the thickness of the metal mask layer.

In one embodiment, the multi-layered masking layer further includes a second dielectric layer and a second metal mask layer both formed below the above metal mask layer, and the manufacturing method for a trench further includes steps of: using the third opening for etching of an exposed portion of the second dielectric layer to expose the second metal mask layer; and using the third opening for etching the exposed second metal mask layer.

In summary, owing to the improve of manufacturing process for trench as disclosed by embodiments of present invention, the depth of the micro-trench associated with and fabricated by embodiments of the present invention can reach to no more than 50 angstroms in depth, and is thus far less than the depth of the conventional micro-trench, the troubles in the subsequent process associated with the prior art can be effectively avoided, the conventional drawbacks associated with over-etching are overcome and the major purpose of developing the present invention is achieved.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Figure 1:
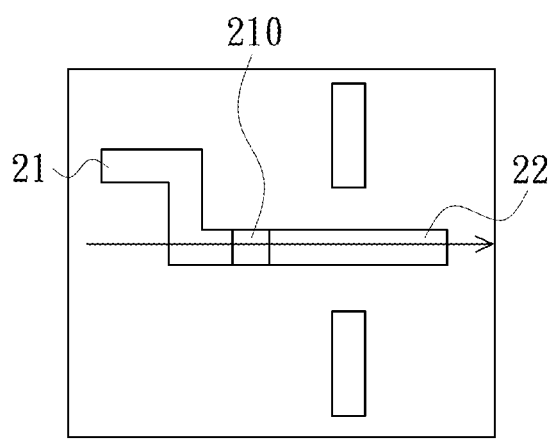
FIG. 1 show a schematic top view of a layout emphasizing an overlay area associated with using two photo-masks to manufacture a trench required for the inlay of copper line.

A better understanding of the above and many other features and advantages of the novel metal line structure and manufacturing method for a trench of the present invention may be obtained from a consideration of the detailed description of some exemplary embodiments thereof below, particularly if such consideration is made in conjunction with the appended drawings, wherein like reference numerals are used to identify like elements illustrated in one or more of the figures thereof.

Referring to FIG. 1, a schematic top view of a layout of trench structure for being inlaid is shown, where an overlay area of two photo-masks is particularly depicted. Specifically, a first part pattern 21 and a second part pattern 22 in FIG. 1 respectively are defined by two photo-masks, and the two part patterns 21, 22 have an overlay area 210. Since the overlay area 210 of the two photo-masks would encounter twice etchings, over-etching would easily occur, causing some troubles in the subsequent process. Accordingly, the present invention is developed to address such issue.

Referring to FIGS. 2(A) through 2(G), schematic views of steps flowchart emphasizing an overlay area of two photo-masks in accordance with a preferred embodiment of the present invention are shown, and detailed description will be made below with reference to cross-sectional drawing taken along the arrow of FIG. 1.

Figure 2A:
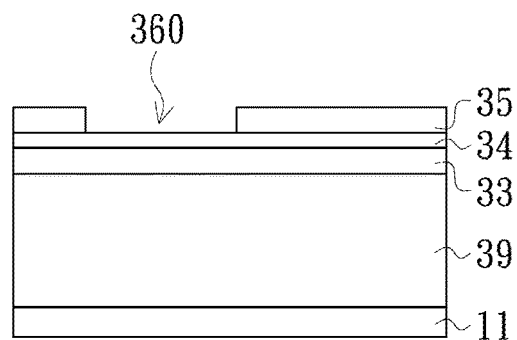
FIGS. 2(A) through 2(H) show schematic views of steps flowchart emphasizing an overlay area in accordance with a preferred embodiment of the present invention.
Figure 2B:
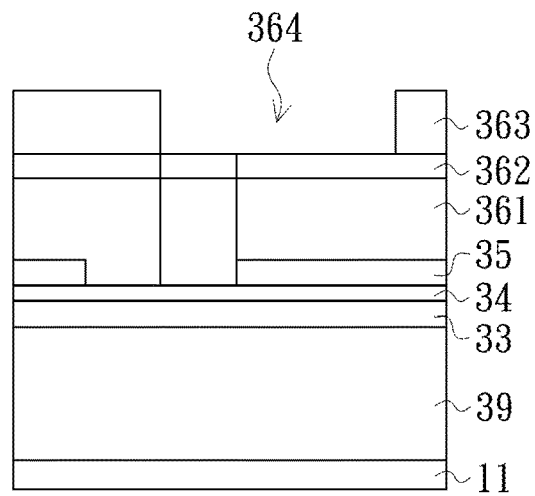

Firstly, FIG. 2(A) shows the cross-sectional view after using a first photo-mask (not shown) to define the first part pattern 21 (as shown in FIG. 1) on a multi-layered masking layer, which is formed on a substrate 11, constituted by a silicon oxynitride layer 33, a titanium nitride/titanium layer 34 and a cap silicon oxide layer 35, and the present embodiment is mainly to partially remove the cap silicon oxide layer 35 but stopped until the titanium nitride/titanium layer 34, so as to form an opening 360 as illustrated in FIG. 2(A). Subsequently as illustrated in FIG. 2(B), after forming tri-layered photo-resist layers 361, 362, 363, a second photo-mask (not shown) is used for defining the photo-resist layer 263 and thereby an opening 364 similar to the second part pattern 22 (as illustrated in FIG. 1) is exposed. The dashed line in FIG. 2(B) denotes the overlay area of the line joints.

Figure 2C:
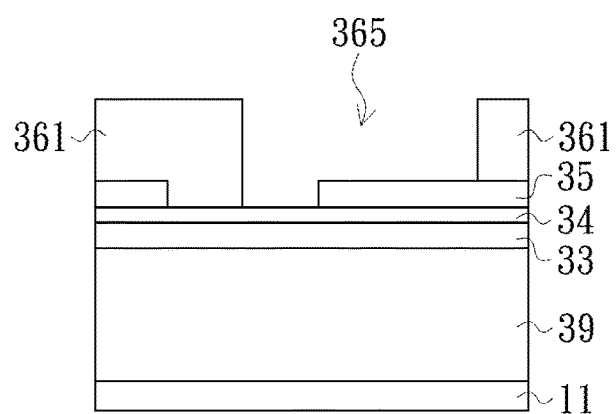
Figure 2D:
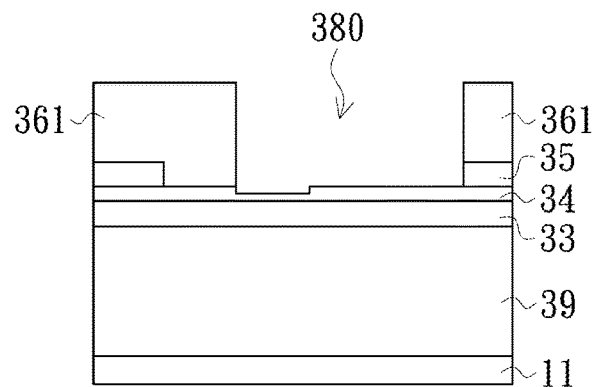
Figure 2E:
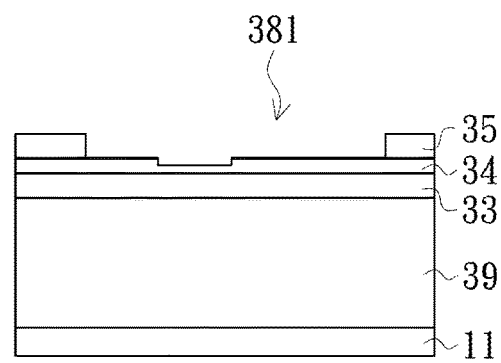

Afterwards, the opening 364 is used for etching of the photo-resist layers 361, 362 to form an opening 365 as illustrated in FIG. 2(C). The exposed portion of the cap silicon oxide layer 35 then is etched and finally the etching is stopped until the titanium nitride/titanium layer 34, so that an opening 380 as illustrated in FIG. 2(D) is formed. After the remained photo-resist layer 361 is removed, an opening 381 is formed as illustrated in FIG. 2(E).

Figure 2F:
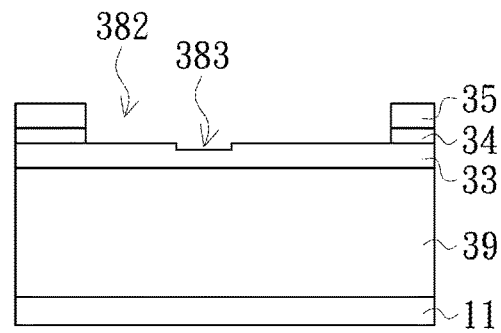
Figure 2G:
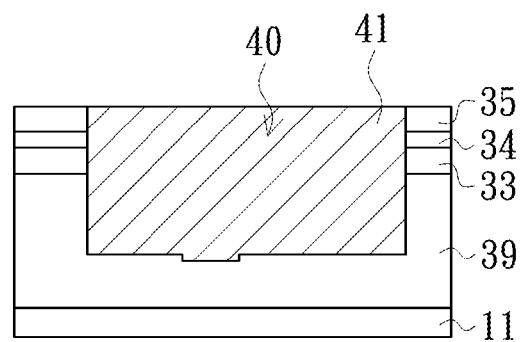
Figure 2H:
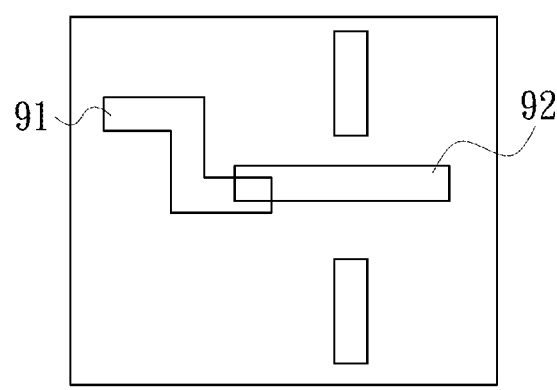

Finally, the opening 381 is used for etching of the underlying titanium nitride/titanium layer 34 and the etching is stopped until the silicon oxynitride layer 33, so that a resultant opening 382 as illustrated in FIG. 2(F) is formed. In the present embodiment, a micro-trench 383 formed at the bottom of the resultant opening 382 has a depth smaller than 50 angstroms, and therefore far less than the depth of a conventional trench formed resulting from the over-etching. In the subsequent process, the resultant opening 382 can be used for manufacturing a trench structure 40 and a conductor line 41 on an ultra-low dielectric constant (ULK) material 39 of an underlying target layer, and finally completes the resultant structure as illustrated in FIG. 2(G). The micro-trench 383 is located in the region formed by a first part pattern of a first photo-mask partially overlying with a second part pattern of a second photo-mask, even if in the situation of the first part pattern 91 and the second part pattern 92 being partially mis-aligned during the first photo-mask overlying with the second photo-mask. In the present embodiment, since the depth of the micro-trench 383 is relatively smaller, the troubles in the subsequent process can be effectively avoided, the conventional drawbacks are overcome and the major purpose of developing the present invention is achieved.

Figure 3A:
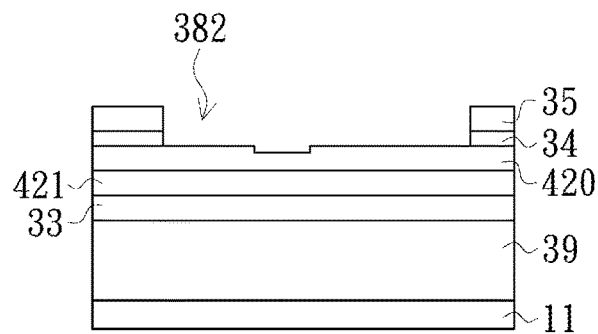
FIGS. 3(A) through 3(C) show schematic views of partial steps flowchart emphasizing an overlay area in accordance with another preferred embodiment of the present invention.
Figure 3B:
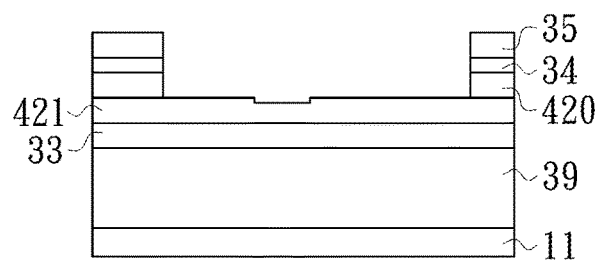
Figure 3C:
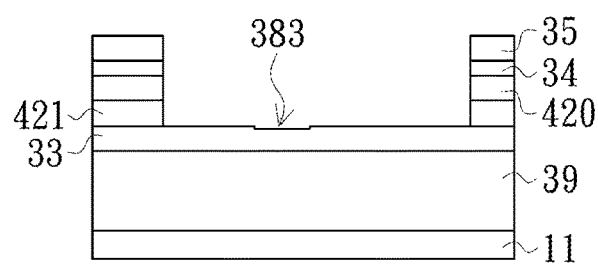

Moreover, in order to further reduce the depth of the micro-trench 383, the titanium nitride/titanium layer 34 and the cap silicon oxide layer 35 can be repeatedly deposited, so that the multi-layered masking layer further includes a second metal mask layer 421 comprised of titanium nitride/titanium and a second dielectric layer 420 made of silicon oxide, besides the above titanium nitride/titanium layer 34 and the cap silicon oxide layer 35. The second metal mask layer 421 and the second dielectric layer 420 are formed below the titanium nitride/titanium layer 34. As illustrated in FIGS. 3(A) through 3(C), after performing the step illustrated in FIG. 2(E), FIG. 3(A) represents using the opening 382 for etching of an exposed portion of the second dielectric layer 420 and thereby exposing the second metal mask layer 421 as illustrated in FIG. 3(B). Thereafter, as illustrated in FIG. 3(C), the opening 382 further is used for etching the exposed second metal mask layer 421 and it is etched to stop until the silicon oxynitride layer 33. Through these repeated etch steps with high etch selectivity to under layer, the depth of the micro-trench 383 can be further reduced and therefore a better flatness at the bottom of trench can be achieved.

Figure 4:
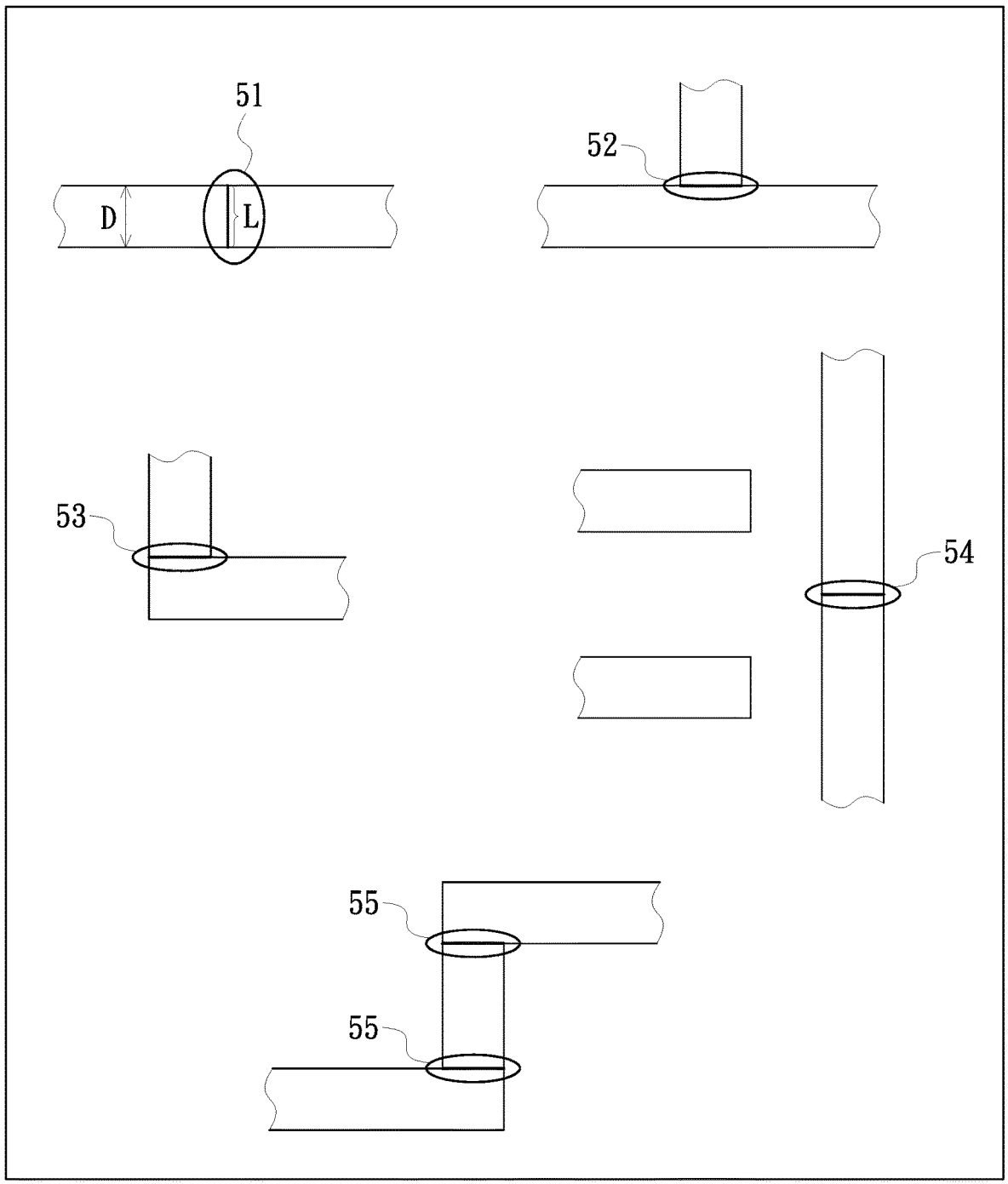
FIG. 4 shows various different implementations of an overlay area of line joints in accordance with the present invention.

In the present embodiment, besides the above-mentioned ultra-low dielectric constant material 39, the target layer can be silicon oxynitride. The completed conductor line 41 can be a gate electrode or an interconnect line, the gate electrode can be made of poly-silicon or metal, and the interconnect line can be a copper line. The overlay area of the line joints can be an I-shaped connecting portion 51, a T-shaped connecting portion 52, an L-shaped bending portion 53, a Π-shaped connecting portion 54 or an S-shaped bending portion 55, as illustrated in FIG. 4. As have been mentioned above, the overlay area of the line joints is formed by two photo-masks respectively defining the line joints, which encounter twice etchings to form the micro-trench. That is, the locations and dimensions of the connecting portions shown in FIG. 4 are substantially the same as the locations and dimensions of the micro-trenches. For example, the length L of the I-shaped connecting portion 51 may represent the length of the micro-trench formed in this overlay area, which is substantially the same as the width D of the line joints, i.e. the width of the resultant opening wherein the micro-trench is formed. As to the multi-layered masking layer constituted by the silicon oxynitride layer 33, the titanium nitride/titanium layer 34 and the cap silicon oxide layer 35, wherein the buffer layer comprised of the silicon oxynitride layer 33 primarily is to release stress, another function of the silicon oxynitride layer 33 is to act as a protective layer to avoid the formation of crater defects in the underlying target layer. The silicon oxynitride layer 33 can be replaced by boron nitride in another embodiment, and furthermore the buffer layer can be omitted. The metal mask layer comprised of the titanium nitride/titanium layer 34 can be made of tantalum nitride, tantalum or other metals instead, and the dielectric layer comprised of the cap silicon oxide layer 35 can be made of silicon nitride, silicon oxynitride, silicon carbide, nitrogen-doped silicon carbide or silicon oxycarbide instead. In addition, in order to ensure the etchings to carry out normally, the metal mask layer and the buffer layer are given an etching selectivity ratio larger than 8 and preferably of about 9~11, and the etching of the metal mask layer can use a chlorine-based etching gas. The dielectric layer and the metal mask layer are given an etching selectivity ratio larger than 5 and preferably of about 6~8, and the etching of the dielectric layer can use a fluorine-based etching gas for example $C_xH_yF_z$. Moreover, in order to ensure the dielectric layer still can act as a mask after multiple times of etching, the thickness of the dielectric layer can be controlled to be in the range of five times of the thickness of the metal mask layer and 0.8 times of the thickness of the metal mask layer; or the thicknesses of the metal mask layer, the dielectric layer and the buffer layer are control to be approximately equal to one another, for example all be about 150 angstroms.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A manufacturing method for a trench, comprising steps of:
   providing a substrate;
   sequentially forming a target layer and a multi-layered masking layer on the substrate, wherein the multi-layered masking layer at least comprises a metal mask layer and a dielectric layer;
   forming a first photo-resist structure layer on the multi-layered masking layer;
   using a first photo-mask to define the first photo-resist structure layer and thereby forming a first opening;
   using the first opening for etching of an exposed portion of the multi-layered masking layer to partially remove the dielectric layer and thereby exposing the metal mask layer, and then removing the first photo-resist structure layer;
   forming a second photo-resist structure layer on the etched multi-layered masking layer;
   using a second photo-mask to define the second photo-resist structure layer and thereby forming a second opening partially overlaid with the first opening;
   using the second opening for etching of an exposed portion of the etched multi-layered masking layer to partially remove the dielectric layer and thereby exposing the metal mask layer and forming a remained dielectric layer, and then removing the second photo-resist structure layer;
   using the remained dielectric layer as a mask for etching of the exposed metal mask layer and thereby forming a third opening; and
   using the third opening for etching of an exposed portion of the target layer and thereby forming the trench.

2. The manufacturing method as claimed in claim 1, wherein the substrate comprises a silicon substrate, and the target layer comprises an ultra-low dielectric constant material.

3. The manufacturing method as claimed in claim 1, further comprising a step of:
   inlaying a conductor line into the trench.

4. The manufacturing method as claimed in claim 3, wherein the conductor line is a gate electrode, and the gate electrode is made of poly-silicon or metal.

5. The manufacturing method as claimed in claim 3, wherein the conductor line is an interconnect line, and the interconnect line is a copper line.

6. The manufacturing method as claimed in claim 1, wherein the multi-layered masking layer further comprises a buffer layer arranged between the metal mask layer and the target layer.

7. The manufacturing method as claimed in claim 6 wherein the buffer layer is made of silicon oxynitride or boron nitride.

8. The manufacturing method as claimed in claim 7, wherein the metal mask layer is a titanium nitride/titanium layer.

9. The manufacturing method as claimed in claim 8, wherein the dielectric layer is made of silicon oxide, silicon nitride, silicon oxynitride, silicon carbide, nitrogen-doped silicon carbide or silicon oxycarbide.

10. The manufacturing method as claimed in claim 6, wherein the metal mask layer and the buffer layer have an etching selectivity ratio larger than 8, and the dielectric layer and the metal mask layer have an etching selectivity ratio larger than 5.

11. The manufacturing method as claimed in claim 1, wherein the first photo-resist structure layer and the second photo-resist structure layer each is a tri-layered photo-resist structure layer.

12. The manufacturing method as claimed in claim 1, wherein a thickness of the dielectric layer is in the range of five times of a thickness of the metal mask layer and 0.8 times of the thickness of the metal mask layer.

13. The manufacturing method as claimed in claim 1, wherein the multi-layered masking layer comprises a second dielectric layer and a second metal mask layer both formed below the metal mask layer, the manufacturing method further comprises steps of:
   using the third opening for etching of the second dielectric layer to expose the second metal mask layer; and
   using the third opening for etching of the exposed second metal mask layer.

* * * * *